United States Patent [19]

Yasuda et al.

[11] Patent Number: 4,490,697
[45] Date of Patent: Dec. 25, 1984

[54] SIGNAL PROPAGATING DEVICE FOR A PLURALITY OF MEMORY CELLS

[75] Inventors: Hiroshi Yasuda, Tokyo; Kiyofumi Ochii, Yokohama, both of Japan

[73] Assignee: Tokyo Shibaura Denki Kabushiki Kaisha, Japan

[21] Appl. No.: 386,091

[22] Filed: Jun. 7, 1982

[30] Foreign Application Priority Data

Jun. 10, 1981 [JP] Japan .................................. 56-89299

[51] Int. Cl.$^3$ .......................... H03H 7/30; H01P 9/00
[52] U.S. Cl. .................................. 333/156; 333/245; 333/236; 365/63; 365/194
[58] Field of Search ............... 333/140, 145, 165, 156, 333/34, 172, 236, 245; 365/149, 150, 197, 198, 191, 194, 221, 76, 63, 72

[56] References Cited

U.S. PATENT DOCUMENTS 3,638,202  1/1972  Schroeder ...................... 307/304 X

OTHER PUBLICATIONS

Wallis et al., "Transmission Line," IBM Technical Disclosure Bulletin, vol. 8, No. 11, Apr., 1966, p. 1493.
"A 25ns 16K×1 Static RAM", T. Tsujido et al. (NEC), ISSCC 81 Digest of Technical Papers, pp. 20-21 and 256.
"Hi-CMOSII 4K Static RAM", O. Minato et al. (Hitachi), ISSCC 81 Digest of Technical Papers, pp. 14-15 and 253.
"An 18ns CMOS/SOS 4K Static RAM", M. Isobe (Toshiba), ISSCC 81 Digest of Technical Papers, pp. 12-13 and 252.
"PN Junction Forms Distributed RC Network," Electrical Design News, vol. 8, No. 4, Apr. 1963, pp. 8-9.
"One-Micron Polycide (WSi2 on Poly-Si) MOSFET Technology," Journal of the Electrochemical Society, vol. 128, No. 10, Oct. 1981, pp. 2207-2214.

*Primary Examiner*—Paul Gensler
*Assistant Examiner*—Benny Lee
*Attorney, Agent, or Firm*—Finnegan, Henderson, Farabow, Garrett & Dunner

[57] ABSTRACT

There is provided a signal propagating device for receiving an input signal at an input end thereof and supplying the input signal to a plurality of memory cells arranged in one row. The signal propagating device includes a word line connected to transmit the input signal and having a plurality of line segments electrically coupled to the memory cells. A preceding one of the line segments is formed to have a larger average width than a succeeding one of the line segments.

3 Claims, 7 Drawing Figures

SIGNAL PROPAGATING DEVICE FOR A PLURALITY OF MEMORY CELLS

BACKGROUND OF THE INVENTION

This invention relates to a signal propagating device having at least one interconnection layer formed of a resistive material.

In a memory device having a plurality of memory cells, the operation of writing and reading data to and from each memory cell is usually controlled by a control signal propagating through a word line. The word line is usually formed of a polycrystalline silicon interconnection layer having resistivity (of about 30Ω/□) in order to prevent interference with aluminum interconnection layers formed in the individual cells. This kind of polycrystalline silicon interconnection layer is designed to have a smaller total width and a larger total length in order to reduce the dimensions of circuit elements in a memory and also increase the storage capacity of the memory. For this reason, the lead resistance is extremely increased, to as high as 10 kΩ, for instance. In another aspect, some portions of the polycrystalline silicon interconnection layer are also used as gate electrodes of MOS transistors constituting memory cells, so that the polycrystalline silicon interconnection layer will be accompanied by large parasitic capacitances. Therefore, a control signal propagated through the polycrystalline silicon interconnection layer is extremely delayed, having increased the time required for making access the memory circuit. In order to reduce the control signal propagation delay, it has been proposed to form the word line with a material having very low resistivity and good conductivity such as molybdenum silicide ($MoSi_2$) instead of the polycrystalline silicon interconnection layer. However, this has not yet been put into practice because there are many technical problems unresolved.

FIG. 1 shows a prior art signal propagating device. A word line 2 of a polycrystalline silicon layer is formed on a plurality of memory cell regions MC-1 to MC-N arranged in a chain. A control signal propagated along the word line 2 is supplied to memory cells formed in the individual memory cell regions. Since the word line 2 is also used as a gate of the MOS transistor constituting each memory cell, the word line cannot be formed to have a uniform width, but it is formed to have an equal average width for the individual memory cell regions. Where the sheet resistance of the polycrystalline silicon layer constituting the word line 2 is denoted by $\rho$, the capacitance per unit area of the layer by CO and the average width and length of the word line respectively by W and 2L, the resistance of the whole word line is given as $\rho \cdot 2L/W$ and the capacitance accompanying the word line is given as $2L \cdot W \cdot CO$. Suppose now that the word line 2 includes two equal sections as shown in FIG. 2. In other words, suppose a circuit where resistors R1 and R2 are respectively connected between points P1 and P2 and between points P2 and P3 and capacitors C1 and C2 are connected to the respective points P2 and P3. The resistance of each of the resistors R1 and R2 is $\rho(L/W)$ ($=R$), and the capacitance of each of the capacitors C1 and C2 is $L \cdot W \cdot CO$ ($=C$). Then, if there is no voltage signal applied to the point P1, there holds a relation $VA = VB = VC$ where VA, VB and VC are respectively the potentials on the points P1, P2 and P3. When a voltage signal with a voltage level of VO is applied to the point P1 at an instant $t=0$, the differentials dVB/dt and dVC/dt of the potentials VB and VC are given as $$C\frac{dVB}{dt} = \frac{(VO - VB)}{R} = -\frac{(VB - VC)}{R} \quad (1)$$

and $$C\frac{dVC}{dt} = \frac{(VB - VC)}{R} \quad (2)$$

By substituting an initial condition of $VB = VC = 0$ at $t=0$ into the equations (1) and (2), we obtain equations $$VB = VO\left(1 - 0.7236e^{-\frac{0.382\,t}{CR}} - 0.2764e^{-\frac{2.61\,t}{CR}}\right) \quad (3)$$

and $$VC = VO\left(1 - 1.171e^{-\frac{0.382\,t}{CR}} + 0.1708e^{-\frac{2.61\,t}{CR}}\right) \quad (4)$$

FIG. 3 shows the potentials VB and VC in the equations (3) and (4) plotted against the time constant t/CR. As is seen, the potential VC at the point C, farther from the point A than the point B, rises more slowly than the potential VB at the point B. In other words, the delay time of the signal propagated through the circuit path is increased with increasing distance from the point of signal application.

SUMMARY OF THE INVENTION

An object of the invention is to provide a signal propagating device, which permits signal propagation as fast as possible.

According to one mode of the invention, there is provided a signal propagating device for receiving an input signal at an input end thereof and supplying the input signal to a plurality of memory cell regions arranged in a chain, comprising signal propagation means connected to transmit the input signal and having a plurality of portions electrically coupled to the plurality of unit circuits, respectively, wherein at least one of the portions has a larger capacitance than at least one of the succeeding portions.

According to the invention, the capacitance for a line segment of a unit length is reduced with the distance from the input end of signal propagation line. Thus, a signal coupled to the input end can be propagated to the output end at a high speed.

DETAILED DESCRIPTION OF THE PREFERRED EMBODIMENT

Figure 1:
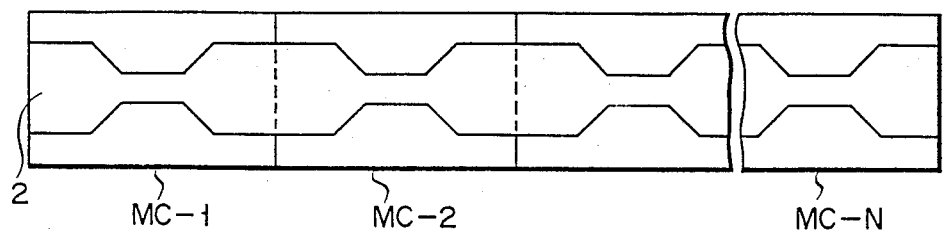
FIG. 1 is a schematic view showing a prior art signal propagating device.
Figure 2:
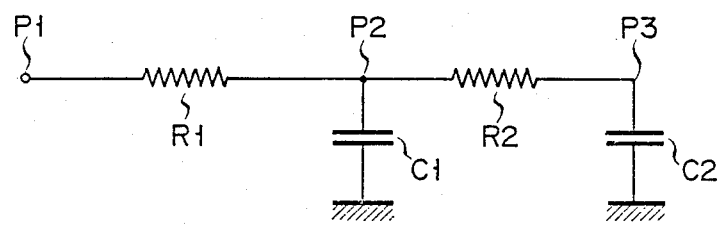
FIG. 2 is an equivalent circuit diagram of the signal propagating device shown in FIG. 1.
Figure 3:
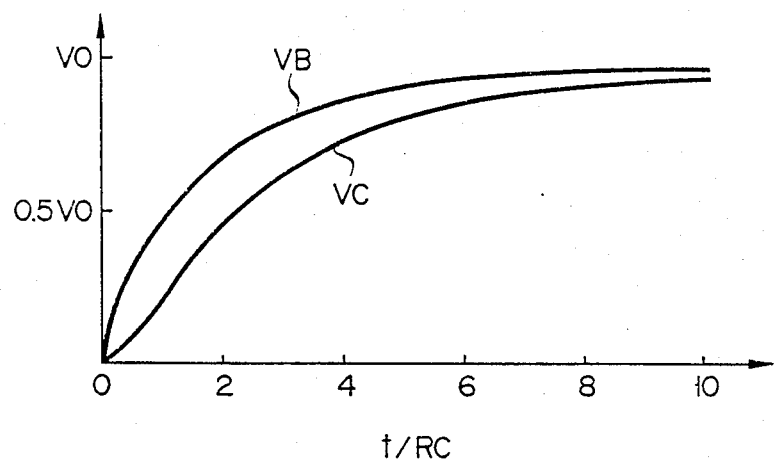
FIG. 3 is a graph showing voltages appearing at different points of a circuit when a predetermined voltage is applied to an input end of the circuit.
Figure 4:
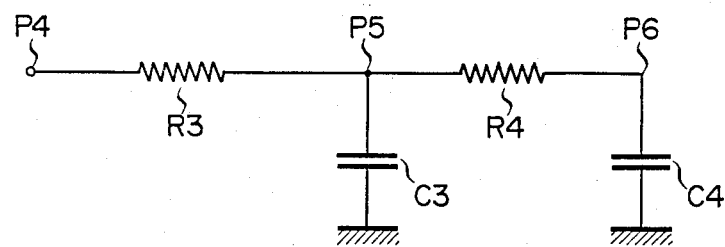
FIG. 4 is an equivalent circuit diagram of part of one embodiment of the signal propagating device according to the invention.

We have tried to improve the propagation speed of a signal propagated through a word line by varying its width. We have assumed a case in which the average width of a portion of the word line 2 in FIG. 1 extending in the memory cell region MC-2 is S times the average width of a portion extending in the memory cell region MC-1. In this case, an equivalent circuit of two segments of the word line 2 in the memory cell regions MC-1 and MC-2 is obtained as shown in FIG. 4. In the circuit of FIG. 4, a resistor R3 with a resistance of RX is provided between points P4 and P5, and a resistor R4 with a resistance of RX/S is provided between points P5 and P6. Capacitors C3 and C4 with respective capacitances CX and S·CX are connected to the respective points P5 and P6. In this case, when there is no voltage signal applied to the point P4, this establishes a relation VX=VY=VZ where VX, VY and VZ are respectively the potentials on the points P4, P5 and P6. When a voltage signal of voltage VO is applied to the point P4 at an instant t=0, the differentials dVY/dt and dVZ/dt of the potentials VY and VZ are $$\frac{dVY}{dt} = \frac{1}{CX}\left(\frac{VO-VY}{RX} - \frac{S}{RX}(VY-VZ)\right) \quad (5)$$

and $$\frac{dVZ}{dt} = \frac{1}{S\cdot CX}\left(\frac{S}{RX}(VY-VZ)\right) \quad (6)$$

Substituting the equation of initial condition VY=VZ=0 at t=0 into the equations (5) and (6), the following equations are obtained:

$$VY = \quad (7)$$

$$VO\left\{1 - \frac{\frac{S}{2}+\sqrt{\tfrac{1}{4}S^2+S}}{\sqrt{S^2+4S}}e^{-(1+\tfrac{1}{2}S-\sqrt{\tfrac{1}{4}S^2+S})\frac{1}{CX\cdot RX}t} - \right.$$

$$\left. \frac{\sqrt{\tfrac{1}{4}S^2+S}-\tfrac{1}{2}S}{\sqrt{S^2+4S}}e^{-(1+\tfrac{1}{2}S+\sqrt{\tfrac{1}{4}S^2+S})\frac{t}{CX\cdot RX}}\right\}$$

and $$VZ = \quad (8)$$

$$VO\left\{1 - \frac{1+\frac{S}{2}+\sqrt{\tfrac{1}{4}S^2+S}}{\sqrt{S^2+4S}}e^{-(1+\tfrac{1}{2}S-\sqrt{\tfrac{1}{4}S^2+S})\frac{1}{CX\cdot RX}t} - \right.$$

$$\left.\frac{\sqrt{\tfrac{1}{4}S^2+S}-\tfrac{1}{2}S-1}{\sqrt{S^2+4S}}e^{-(1+\tfrac{1}{2}S+\sqrt{\tfrac{1}{4}S^2+S})\frac{t}{CX\cdot RX}}\right\}$$

Figure 5:
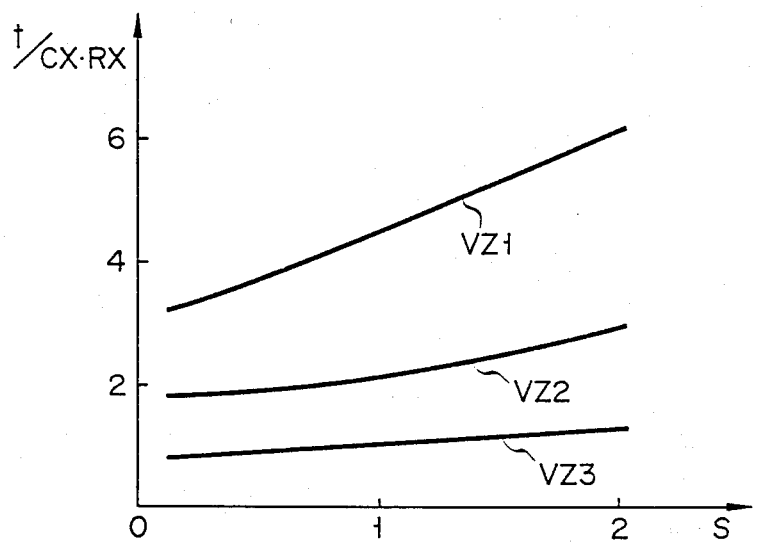
FIG. 5 is a graph showing the relation between the time until the potential at a point in the equivalent circuit of FIG. 4 reaches a predetermined level and the average width ratio between two line segments of the word line.

FIG. 5 shows the relation between the width ratio S and the time t until the potential VZ in equation (8) which is initially set at 0 V reaches a predetermined value. In the graph, the ordinate is taken for t/CX·RX, and the abscissa is taken for S. Curves VZ1, VZ2 and VZ3 represent cases where the predetermined voltage reached by the voltage VZ is respectively 0.80 V, 0.50 V and 0.2 V.

It will be seen from FIG. 5 that the time until the potential VX reaches the predetermined level is reduced with reducing width ratio S. In other words, the propagation speed of signal propagated through the word line is propagated by forming the segment of the word line 2 extending over the memory cell region MC-2 to have a smaller width than the segment extending over the memory cell region MC-1 in FIG. 1.

Figure 6:
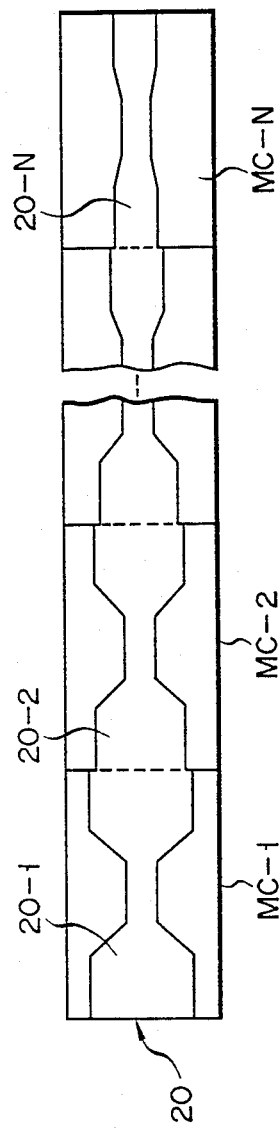
FIG. 6 is a schematic view showing one embodiment of the signal propagating device according to the invention.

FIG. 6 shows one embodiment of the signal propagating device according to the invention, having memory cell regions MC-1 to MC-N arranged in a row. Memory cells (not shown) for storing one bit of data are formed in the respective memory cell regions MC-1 to MC-N. These memory cells are driven by a row selection signal which is transmitted through a word line 20 constituted by a polycrystalline silicon interconnection layer. The word line 20 in this embodiment has word line segments 20-1 to 20-N extending over the respective memory cell regions MC-1 to MC-N and having different average widths. It is to be noted that the width of the word line 20 is made progressively smaller in the direction of signal propagation, that is, the average width of the word line segments 20-1 to 20-N is made progressively smaller in the mentioned order. With this arrangement, the signal propagation time until a row selection signal applied to the word line segment 20-1 reaches, for instance, the word line segment 20-N, is reduced compared with the case where the line segments 20-1 to 20-N have the same average width.

Figure 7:
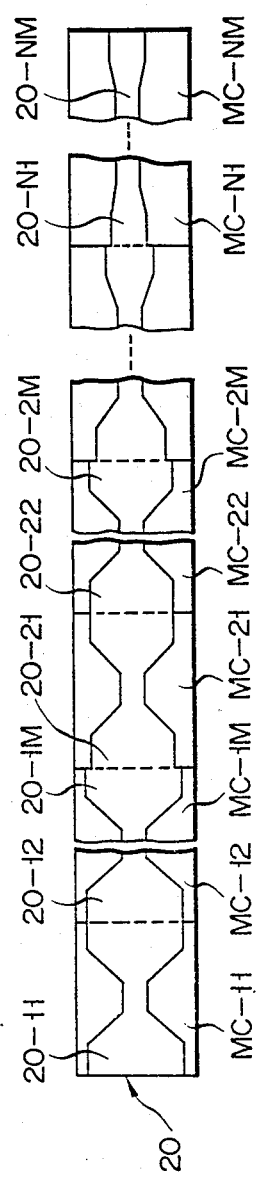
FIG. 7 is a schematic view showing a different embodiment of the signal propagating device according to the invention.

FIG. 7 shows a different embodiment of the signal propagating device according to the invention. In the preceding embodiment of FIG. 6, the word line 20 is so formed as to have a different width for the respective memory cell regions MC-1 to MC-N. Actually, however, there are many cases where hundreds of memory cells are arranged in a row, and in such cases it is very difficult to vary the average width of the word line for each of the memory cell regions. In the embodiment shown in FIG. 7, accordingly, a word line 20 which is formed on NM memory cell regions MC-11 to MC-1M, MC-21 to MC-2M, . . . , and MC-N1 to MC-NM arranged in a row, has word line segments 20-11 to 20-1M, 20-21 to 20-2M, . . . , and 20-N1 to 20-NM. As is seen from FIG. 7, the word line segments 20-11 to 20-1M have an equal average width, and the word line segments 20-21 to 20-2M in the next group have an equal average width for the group but smaller than the average width of the word line segments 20-11 to 20-1M in the first group. In other words, the word line segments 20-11 to 20-NM are formed to have progressively smaller average widths for the N successive groups of segments. Like the previous embodiment, the signal propagation time until a signal applied to the word line segments 20-11 reaches the word line segment 20-NM can thus be reduced.

While some preferred embodiments have been described in the foregoing, they are given for the purpose of illustration only, and various changes and modifications are possible. For example, the number of word line segments in one segment group which has been M in the embodiment of FIG. 7 may be varied.

Further, while the above embodiments have concerned with word line, the invention is applicable to all signal propagation lines where the delay time involved in the propagation of signal through the line is noticeable. Further, polycrystalline silicon as the interconnection layer may be replaced with any other suitable resistive material.

Further, it is possible to reduce the width of the word line not step-wise but continuously. Further, the width may be increased for an intermediate portion of line and then reduced for portions nearer the output end again.

What we claim is:

1. A signal propagating device for receiving an input signal at an input end thereof and supplying the input signal to a plurality of memory cells arranged in a chain, comprising:

signal propagation means connected to transmit the input signal and having a plurality of word line segments electrically coupled to said plurality of memory cells, respectively, where the average width of said word line segments decreases as said segments extend from said input end.

2. A signal propagating device according to claim 1, wherein said plurality of word line segments are respectively formed of a plurality of line segments separated into a plurality of groups, wherein line segments in the same group have substantially the same capacitance and the same average width.

3. A signal propagating device according to claim 2, wherein said word line segments in one group have substantially a larger average width than those in another group succeeding to said one group.

* * * * *